United States Patent
Chou et al.

(10) Patent No.: US 8,581,404 B2
(45) Date of Patent: Nov. 12, 2013

(54) STRUCTURE OF GOLD BUMPS AND GOLD CONDUCTORS ON ONE IC DIE AND METHODS OF MANUFACTURING THE STRUCTURES

(75) Inventors: Chiu-Ming Chou, Kaohsiung (TW); Mou-Shiung Lin, Hsinchu (TW)

(73) Assignee: Megit Acquistion Corp., San Diego, CA (US)

( * ) Notice: Subject to any disclaimer, the term of this patent is extended or adjusted under 35 U.S.C. 154(b) by 1190 days.

(21) Appl. No.: 12/262,195

(22) Filed: Oct. 31, 2008

(65) Prior Publication Data

US 2009/0057894 A1   Mar. 5, 2009

Related U.S. Application Data

(63) Continuation of application No. 11/178,541, filed on Jul. 11, 2005, now Pat. No. 7,465,654.

(60) Provisional application No. 60/586,840, filed on Jul. 9, 2004.

(30) Foreign Application Priority Data

Aug. 12, 2004 (TW) .................. 93124492 A
Dec. 10, 2004 (TW) .................. 93138329 A

(51) Int. Cl.
*H01L 23/48* (2006.01)
*H01L 23/52* (2006.01)
*H01L 29/40* (2006.01)

(52) U.S. Cl.
USPC ........... 257/750; 257/753; 257/758; 257/768; 257/775; 257/E23.153

(58) Field of Classification Search
USPC .................. 257/750, 758, E23.153
See application file for complete search history.

(56) References Cited

U.S. PATENT DOCUMENTS

| | | | |
|---|---|---|---|
| 3,668,484 A | 6/1972 | Greig et al. | |
| 4,685,998 A | 8/1987 | Quinn | |

(Continued)

FOREIGN PATENT DOCUMENTS

| | | |
|---|---|---|
| EP | 1536469 | 6/2005 |
| JP | 02213147 | 8/1990 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Angel Roman
(74) *Attorney, Agent, or Firm* — Seyfarth Shaw LLP

(57) ABSTRACT

A method for fabricating multiple metal layers includes the following steps. An electronic component is provided with multiple contact points. A first metal layer is deposited over said electronic component. A first mask layer is deposited over said first metal layer. A second metal layer is deposited over said first metal layer exposed by an opening in said first mask layer. Said first mask layer is removed. A second mask layer is deposited over said second metal layer. A third metal layer is deposited over said second metal layer exposed by an opening in said second mask layer. Said second mask layer is removed. Said first metal layer not covered by said second metal layer is removed.

23 Claims, 8 Drawing Sheets

(56) References Cited

U.S. PATENT DOCUMENTS

| | | |
|---|---|---|
| 4,789,647 A | 12/1988 | Peters |
| 4,825,276 A | 4/1989 | Kobayashi |
| 5,046,161 A | 9/1991 | Takada |
| 5,061,985 A | 10/1991 | Meguro et al. |
| 5,083,187 A | 1/1992 | Lamson et al. |
| 5,226,232 A | 7/1993 | Boyd |
| 5,244,833 A | 9/1993 | Gansauge et al. |
| 5,384,488 A | 1/1995 | Golshan |
| 5,468,984 A | 11/1995 | Efland et al. |
| 5,532,512 A | 7/1996 | Fillion |
| 5,631,499 A | 5/1997 | Hosomi |
| 5,659,201 A | 8/1997 | Wollesen |
| 5,665,989 A | 9/1997 | Dangelo |
| 5,691,248 A | 11/1997 | Cronin |
| 5,726,502 A | 3/1998 | Beddingfield |
| 5,767,010 A | 6/1998 | Mis et al. |
| 5,792,594 A | 8/1998 | Brown |
| 5,834,844 A | 11/1998 | Akagawa |
| 5,854,513 A | 12/1998 | Kim |
| 5,883,435 A | 3/1999 | Geffken |
| 5,892,273 A | 4/1999 | Iwasaki |
| 5,952,726 A | 9/1999 | Liang |
| 5,994,766 A | 11/1999 | Shenoy |
| 6,011,314 A | 1/2000 | Leibovitz |
| 6,013,571 A | 1/2000 | Morrell |
| 6,022,792 A | 2/2000 | Ishii |
| 6,075,290 A | 6/2000 | Schaefer et al. |
| 6,077,726 A | 6/2000 | Mistry |
| 6,107,180 A | 8/2000 | Munroe et al. |
| 6,144,100 A | 11/2000 | Shen |
| 6,181,569 B1 | 1/2001 | Chakravorty |
| 6,184,143 B1 | 2/2001 | Ohashi |
| 6,187,680 B1 | 2/2001 | Costrini |
| 6,229,711 B1 | 5/2001 | Yoneda |
| 6,251,501 B1 | 6/2001 | Higdon et al. |
| 6,287,893 B1 | 9/2001 | Elenius et al. |
| 6,288,447 B1 | 9/2001 | Amishiro |
| 6,300,250 B1 | 10/2001 | Tsai |
| 6,359,328 B1 | 3/2002 | Dubin |
| 6,362,087 B1 | 3/2002 | Wang et al. |
| 6,375,062 B1 | 4/2002 | Higdon et al. |
| 6,380,061 B1 | 4/2002 | Kobayashi et al. |
| 6,383,916 B1 | 5/2002 | Lin |
| 6,426,281 B1 | 7/2002 | Lin |
| 6,429,120 B1 | 8/2002 | Ahn |
| 6,472,745 B1 | 10/2002 | Iizuka |
| 6,479,900 B1 | 11/2002 | Shinogi |
| 6,495,442 B1 | 12/2002 | Lin |
| 6,518,092 B2 | 2/2003 | Kikuchi |
| 6,578,754 B1 | 6/2003 | Tung |
| 6,605,528 B1 | 8/2003 | Lin |
| 6,613,663 B2 | 9/2003 | Furuya |
| 6,614,091 B1 | 9/2003 | Downey |
| 6,639,299 B2 | 10/2003 | Aoki |
| 6,642,136 B1 | 11/2003 | Lee et al. |
| 6,646,347 B2 | 11/2003 | Mercado |
| 6,653,563 B2 | 11/2003 | Bohr |
| 6,680,544 B2 | 1/2004 | Lu |
| 6,683,380 B2 | 1/2004 | Efland |
| 6,707,124 B2 | 3/2004 | Wachtler |
| 6,707,159 B1 | 3/2004 | Kumamoto |
| 6,756,295 B2 | 6/2004 | Lin |
| 6,762,115 B2 | 7/2004 | Lin |
| 6,762,122 B2 | 7/2004 | Mis |
| 6,780,748 B2 | 8/2004 | Yamaguchi |
| 6,841,872 B1 | 1/2005 | Ha et al. |
| 6,853,076 B2 | 2/2005 | Datta |
| 6,853,078 B2 * | 2/2005 | Yamaya et al. ............... 257/750 |
| 6,861,740 B2 | 3/2005 | Hsu |
| 6,940,169 B2 | 9/2005 | Jin |
| 6,943,440 B2 | 9/2005 | Kim |
| 6,959,856 B2 | 11/2005 | Oh et al. |
| 6,963,136 B2 | 11/2005 | Shinozaki et al. |
| 6,977,435 B2 | 12/2005 | Kim et al. |
| 7,078,331 B2 | 7/2006 | Kwon et al. |
| 7,220,657 B2 | 5/2007 | Ihara |
| 7,230,340 B2 | 6/2007 | Lin |
| 7,239,028 B2 | 7/2007 | Anzai |
| 7,420,276 B2 | 9/2008 | Lin |
| 7,470,997 B2 | 12/2008 | Lin |
| 7,547,969 B2 | 6/2009 | Chou |
| 2001/0026954 A1 | 10/2001 | Takao |
| 2001/0040290 A1 | 11/2001 | Sakurai |
| 2001/0051426 A1 | 12/2001 | Pozder |
| 2002/0016079 A1 | 2/2002 | Dykstra et al. |
| 2002/0043723 A1 | 4/2002 | Shimizu |
| 2002/0079576 A1 | 6/2002 | Seshan |
| 2002/0100975 A1 | 8/2002 | Kanda |
| 2002/0158334 A1 | 10/2002 | Vu |
| 2003/0006062 A1 | 1/2003 | Stone |
| 2003/0008133 A1 | 1/2003 | Paik et al. |
| 2003/0020163 A1 | 1/2003 | Hung et al. |
| 2003/0052409 A1 | 3/2003 | Matsuo et al. |
| 2003/0080416 A1 | 5/2003 | Jorger et al. |
| 2003/0127730 A1 | 7/2003 | Weng |
| 2003/0127734 A1 | 7/2003 | Lee et al. |
| 2003/0162383 A1 | 8/2003 | Yamaya et al. |
| 2003/0168733 A1 | 9/2003 | Hashimoto |
| 2003/0218246 A1 | 11/2003 | Abe |
| 2004/0007779 A1 | 1/2004 | Arbuthnot |
| 2004/0023450 A1 | 2/2004 | Katagiri |
| 2004/0040855 A1 | 3/2004 | Batinovich |
| 2004/0048202 A1 | 3/2004 | Lay et al. |
| 2004/0070042 A1 | 4/2004 | Lee et al. |
| 2004/0130020 A1 | 7/2004 | Kuwabara et al. |
| 2004/0145052 A1 | 7/2004 | Ueno et al. |
| 2004/0166659 A1 | 8/2004 | Lin et al. |
| 2004/0188839 A1 | 9/2004 | Ohtsuka et al. |
| 2006/0060961 A1 | 3/2006 | Lin |
| 2006/0076678 A1 | 4/2006 | Kim et al. |
| 2006/0091540 A1 | 5/2006 | Chou et al. |
| 2006/0267198 A1 * | 11/2006 | Lin et al. ............... 257/750 |
| 2008/0136023 A1 * | 6/2008 | Komai et al. ............... 257/737 |

FOREIGN PATENT DOCUMENTS

| | | |
|---|---|---|
| JP | 11274200 | 10/1999 |
| JP | 11354579 | 12/1999 |
| JP | 2000036515 | 2/2000 |
| JP | 2003031727 | 1/2003 |
| JP | 2003229451 | 8/2003 |
| JP | 2004193301 | 7/2004 |
| TW | 419765 | 1/2001 |
| TW | 483045 | 4/2002 |
| TW | 490803 | 6/2002 |
| TW | 498529 | 8/2002 |
| TW | 506025 | 10/2002 |
| TW | 511243 | 11/2002 |
| TW | 515016 | 12/2002 |
| TW | 517334 | 1/2003 |
| TW | 518700 | 1/2003 |
| TW | 519707 | 2/2003 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

(56) References Cited

OTHER PUBLICATIONS

Roesch, W. et al. "Cycling copper flip chip interconnects," Microelectronics Reliability, 44 (2004) pp. 1047-1054.
Lee, Y-H. et al. "Effect of ESD Layout on the Assembly Yield and Reliability," International Electron Devices Meeting (2006) pp. 1-4.
Yeoh, T-S. "ESD Effects On Power Supply Clamps," Proceedings of the 6th International Sympoisum on Physical & Failure Analysis of Integrated Circuits (1997) pp. 121-124.
Edelstein, D. et al. "Full Copper Wiring in a Sub-0.25 pm CMOS ULSI Technology, " Technical Digest IEEE International Electron Devices Meeting (1997) pp. 773-776.
Venkatesan, S. et al. "A High Performance 1.8V, 0.20 pm CMOS Technology with Copper Metallization, " Technical Digest IEEE International Electron Devices Meeting (1997) pp. 769-772.
Jenei, S. et al. "High Q Inductor Add-on Module in Thick Cu/SiLK™ single damascene, " Proceedings from the IEEE International Interconnect Technology Conference (2001) pp. 107-109.
Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technolog™—MEGIC ® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

\* cited by examiner

STRUCTURE OF GOLD BUMPS AND GOLD CONDUCTORS ON ONE IC DIE AND METHODS OF MANUFACTURING THE STRUCTURES

This application is a continuation of Ser. No. 11/178,541, filed on Jul. 11, 2005, now U.S. Pat. No. 7,465,654, which claims priority to U.S. Provisional Patent Application Ser. No. 60/586,840, filed on Jul. 9, 2004, and claims the priority benefit of Taiwan application serial no. 93124492, filed on Aug. 12, 2004 and Taiwan application serial no. 93138329, filed on Dec. 10, 2004.

RELATED PATENT APPLICATION

This application is related to Ser. No. 11/178,753, filed on Jul. 11, 2005, now pending, assigned to a common assignee, which is herein incorporated by reference in its entirety.

BACKGROUND OF THE INVENTION

1. Field of the Invention

This invention relates to structures and methods of manufacture and assembly of integrated circuit chips. More particularly, this invention relates to forming structures of bumps and circuit lines on the same IC die.

2. Description of the Related Art

Gold bumps have been widely used for TAB (Tape-Automated-Bonding) assembly. Recently LCD (Liquid Crystal Display) panels have become mainstream for display technology. Gold bumps are created on the LCD driver IC (integrated circuit) dies and used for Tape-Carrier-Package (TCP), Chip-on-Film (COF), or Chip-on-Glass (COG) assembly.

U.S. Pat. No. 6,653,235 to Liang et al describes methods of forming Ni/Cu or Ni/Au bumps by electroplating and also forming a metal redistribution layer that is preferably copper.

SUMMARY OF THE INVENTION

An object of this invention is to provide a structure of gold bumps and gold conductors on an IC chip.

Another object of this invention is to provide a method for forming a structure of gold bumps and gold conductors on an IC chip.

A further object is to provide structures of gold metals having different thicknesses on an IC.

A still further object is to provide a method of forming structures of gold metals having different thicknesses on an IC.

In accordance with the objects of the invention, an integrated circuit chip having gold metal structures of different thicknesses is achieved. The integrated circuit chip comprises a substrate having semiconductor devices and interconnection lines formed thereover. A passivation layer overlies the substrate. Gold metal structures overlie the passivation layer wherein a first subset of the gold metal structures has a first thickness and a second subset of the gold metal structures has a second thickness greater than the first thickness.

Also in accordance with the objects of the invention, a method of fabricating gold metal structures on an integrated circuit is achieved. An integrated circuit chip is provided covered by a passivation layer wherein openings are formed through the passivation layer to underlying contact pads. An adhesion/barrier layer is sputtered overlying the passivation layer and the contact pads. A seed layer is sputtered or electroplated overlying the adhesion/barrier layer. A first mask is formed on the seed layer, wherein multiple openings in the first mask expose the seed layer. A first gold layer having a first thickness is electroplated on the seed layer exposed through the openings in the first mask. Thereafter, a second mask is formed on the seed layer or on the gold layer, wherein multiple openings in the second mask expose the seed layer or the first gold layer. A second gold layer having a second thickness is electroplated on the seed layer or the first gold layer exposed through the openings in the second mask. Thereafter, the seed layer and adhesion/barrier layer not covered by the first gold layer are removed.

DETAILED DESCRIPTION OF THE INVENTION

Figure 1:
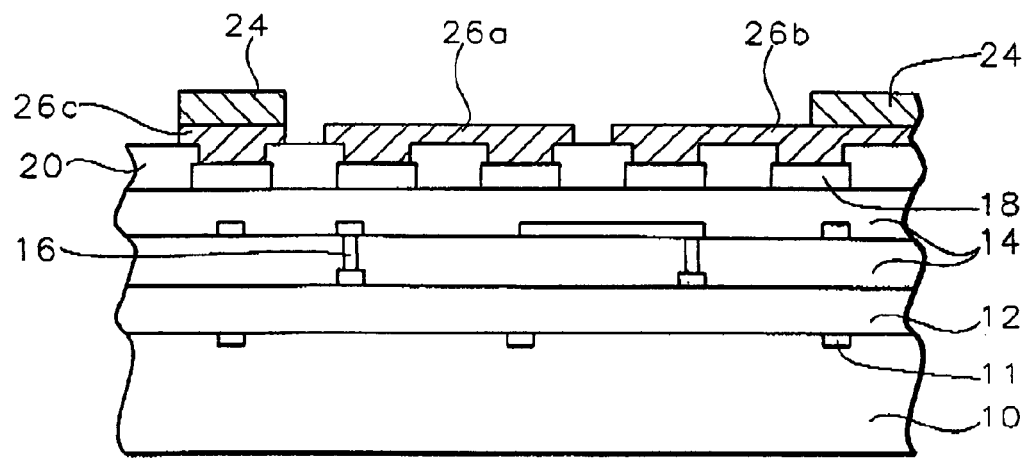
FIGS. 1 through 4 are cross-sectional views of completed gold structures of the present invention.

In the present invention, it is desired to create a new structure of gold circuits on LCD driver IC dies in addition to gold bumps. The gold circuits may be thinner than the gold bumps and may be used for interconnection between two circuits on the die, redistribution of the original I/O pads, power/ground planes or buses, or an electrical connection only for an external circuitry component bonded to the die.

In the present invention, gold metal structures of different thicknesses are fabricated using cost-effective methods of manufacture. This method is especially valuable to the concurrent LCD driver IC's in that it provides gold bumps and gold interconnect or RDL (redistribution layer) on one die. Gold bumps are typically thicker than gold circuits used for interconnection or RDL.

FIGS. 1 through 4 illustrate various combinations of thick and thin gold metal structures of the invention. It will be understood that the invention is not limited to those structures so illustrated, but is equally applicable to any desired combinations of structures.

Semiconductor substrate 10 is shown in FIGS. 1-4. Transistors and other devices, such as MOS or passive devices, are formed in and on the semiconductor substrate 10. These are represented by devices 11 in the figures. Dielectric layer 12 comprising silicon oxide or silicon nitride is formed over the substrate 10. Metal interconnections 16 and 18 and intermetal dielectric layers 14 are formed over the dielectric layer 12. The metal interconnections 16 may comprise aluminum, an aluminum-copper alloy, or an aluminum-silicon alloy deposited by a sputter process or they may comprise copper deposited by an electroplating process. The intermetal dielectric layers 14 may comprise silicon oxide. We refer to the interconnections 16 and 18 as the fine line metal interconnection thinner than 1 micrometer. Overlying these layers 14 are the topmost fine line metal layer 18 comprising contact pads that are connected to devices 11, and are in some instances to be connected to surrounding circuitry. Passivation layer 20 is formed over the topmost dielectric layer 14. Multiple openings in the passivation layer 20 exposes the contact pads. The passivation layer 20 have a thickness, preferably, thicker than about 0.3 um. The passivation layer 20 is composed of a silicon-oxide layer, a silicon-nitride layer, a phosphosilicate glass (PSG) layer, or a composite structure comprising the above-mentioned layers. The passivation layer 20 comprises one or more insulating layers, such as silicon-nitride layer or silicon-oxide layer, formed by CVD processes. For example, a silicon-nitride layer with a thickness of between 0.2 and 1.2 micrometers is formed over a silicon-oxide layer with a thickness of between 0.1 and 0.8 micrometers. Generally, the passivation layer 20 comprises a topmost silicon-nitride layer or a topmost silicon-oxide layer in the finished chip structure. The passivation layer 20 comprises a topmost CVD insulating layer in the finished chip structure. The passivation layer prevents the penetration of mobile ions, such as sodium ions, moisture, transition metals, such as gold, silver, copper, and so on, and other contaminations. The passivation layer is used to protect the underlying devices, such as transistors, polysilicon resistors, poly-to-poly capacitors, and fine-line metal interconnections.

In one embodiment of the invention, FIG. 1 illustrates an interconnection circuit 26 deposited on the passivation layer 20, and bumps 24 formed on the interconnection circuits 26b and 26c. The interconnection circuits 26a and 26b are used to make connections between multiple portions of the fine line metal layer 18 under the passivation layer 20 and to transmit a signal, such as an address signal, a data signal, a clock signal, a logic signal or an analog signal, from one portion of the fine line metal layer to at least one other portion. The interconnection circuit 26a is not connected to an external circuitry component through bumps. The interconnection circuit 26b may be connected to an external circuitry component through bumps 24.

In the case as shown in FIG. 1, the interconnection circuits 26a, 26b and 26c may comprise a topmost metal layer with a thickness of between 2 micrometers and 30 micrometers and with greater than 90 weight percent gold, and, preferably, greater than 97 weight percent gold, and the bumps 24 may comprise a topmost metal layer with a thickness of between 7 micrometers and 30 micrometers and with greater than 90 weight percent gold, and, preferably, greater than 97 weight percent gold.

Figure 2:
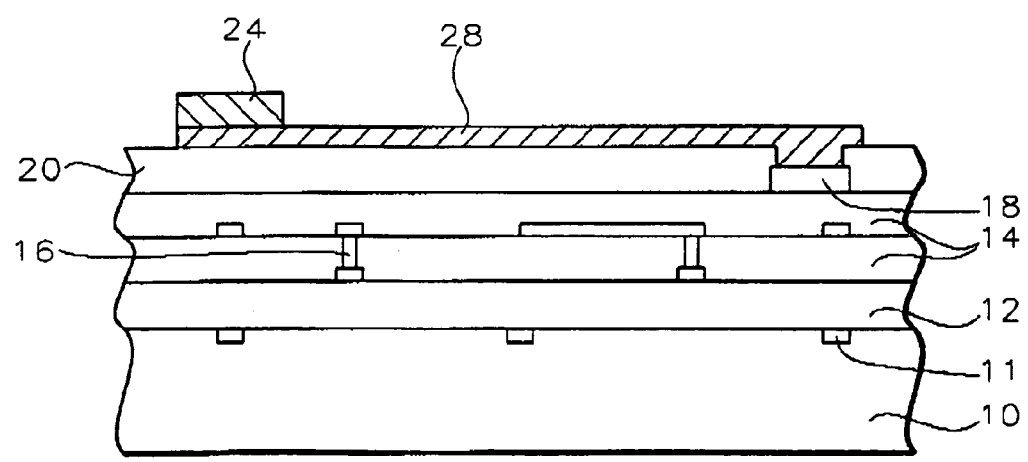

In another embodiment of the invention, FIG. 2 shows a bump 24 and a redistribution line (RDL) 28, wherein the bump 24 is formed on the RDL 28. The RDL 28 is formed on the passivation layer 20 and connects an original contact pad of the fine line metal layer 18 to the bump 24. The positions of the original contact pad and the bump 24 from a top view are different. The RDL 28 may be used to transmit signals or to be connected to a power or ground reference.

In the case as shown in FIG. 2, the RDL 28 may comprise a topmost metal layer with a thickness of between 2 micrometers and 30 micrometers and with greater than 90 weight percent gold, and, preferably, greater than 97 weight percent gold, and the bump 24 may comprise a topmost metal layer with a thickness of between 7 micrometers and 30 micrometers and with greater than 90 weight percent gold, and, preferably, greater than 97 weight percent gold.

Figure 3:
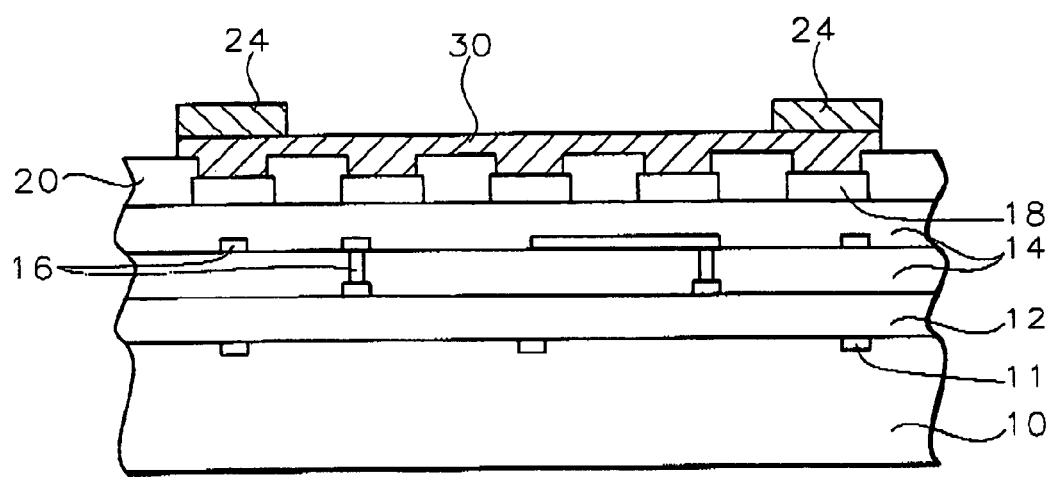

In yet another embodiment of the invention, FIG. 3 illustrates a power plane or bus or ground plane or bus 30 and bumps 24, wherein the bumps 24 are deposited on the power plane or bus or ground plane or bus 30. The power plane or bus or ground plane or bus 30 is connected to multiple contact pads of the topmost fine line metal layer 18 to distribute the power voltage, or ground, to as many points as needed in the IC die. The power plane or bus or ground plane or bus 30 can be connected to a power plane or bus or ground plane or bus under the passivation layer 20 and/or can be connected to a power plane or bus or ground plane or bus in an external circuitry component through the bumps 24.

In the case as shown in FIG. 3, the power plane or bus or ground plane or bus 30 may comprise a topmost metal layer with a thickness of between 2 micrometers and 30 micrometers and with greater than 90 weight percent gold, and, preferably, greater than 97 weight percent gold, and the bumps 24 may comprise a topmost metal layer with a thickness of between 7 micrometers and 30 micrometers and with greater than 90 weight percent gold, and, preferably, greater than 97 weight percent gold.

Figure 4:
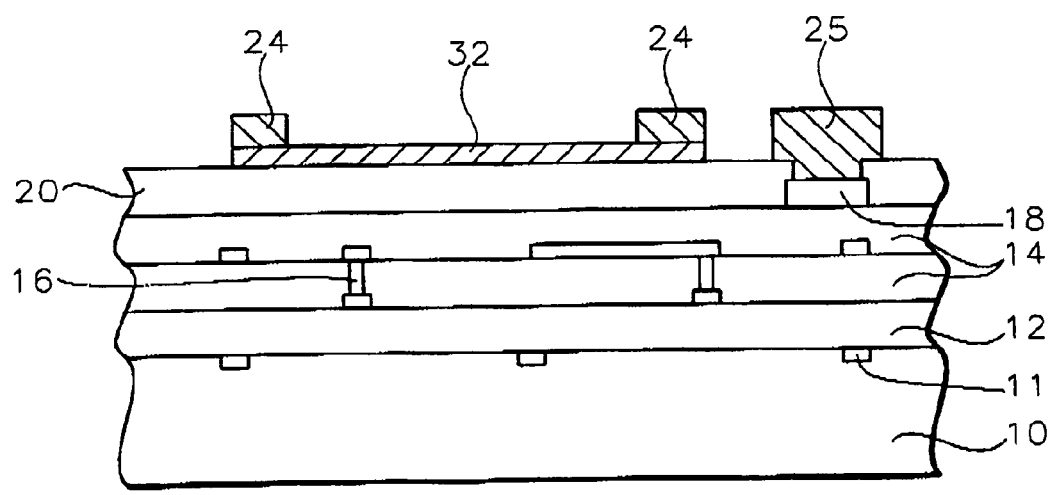

In another embodiment of the invention, FIG. 4 shows bump 24 and 25 and an electrical jump 32 that is an interconnection, a power plane or bus, or a ground plane or bus only for an external circuitry component, such as a glass circuitry substrate. The bumps 24 are formed on the electrical jump 32. The electrical jump 32 formed on the passivation layer 20 is disconnected to the fine line metal layers 18 and 16 under the passivation layer 20, but can be connected to an external circuitry component, such as a glass circuitry substrate, via the bumps 24. A signal, such as an address signal, a data signal, a clock signal, a logic signal or an analog signal, can be transmitted from an end of the external circuitry component to the other end of the external circuitry component through the electrical jump 32. Alternatively, the electrical jump 32 can be a power plane or bus providing a power reference for the external circuitry component via the bumps 24. Alternatively, the electrical jump 32 can be a ground plane or bus providing a ground reference for the external circuitry component via the bumps 24.

In the case as shown in FIG. 4, the electrical jump 32 may comprise a topmost metal layer with a thickness of between 2 micrometers and 30 micrometers and with greater than 90 weight percent gold, and, preferably, greater than 97 weight percent gold, and the bumps 24 may comprise a topmost metal layer with a thickness of between 7 micrometers and 30 micrometers and with greater than 90 weight percent gold, and, preferably, greater than 97 weight percent gold. The bump 25 may be formed by sputtering a titanium-tungsten alloy, functioning as a adhesion/barrier layer, on a contact pad of the topmost fine line metal layer 18, and then electroplating a bulk metal layer with a thickness of greater than 5 micrometers, and preferably between 7 micrometers and 100 micrometers, on the adhesion/barrier layer, wherein the bulk metal layer may comprise gold with greater than 90 weight percent, and, preferably, greater than 97 weight percent.

The metal circuit layers 26a, 26b, 26c, 28, 30 and 32 as shown In FIGS. 1-4 may not be limited to the above description. The above-mentioned metal circuit layers 26a, 26b, 26c, 28, 30 and 32 may be composed of an adhesion/barrier layer and a bulk metal layer, for example. The adhesion/barrier layer is formed over and in touch with the above-mentioned passivation layer 20. The bulk metal layer is formed over the adhesion/barrier layer. The adhesion/barrier layer may comprise titanium, a titanium-tungsten alloy, titanium nitride, tantalum or tantalum nitride, for example. The bulk metal layer may comprise gold, for example. The bulk metal layer may have a thickness thicker than 1 micrometer, and preferably between 2 micrometers and 30 micrometers, wherein the bulk metal layer may comprise gold with greater than 90 weight percent, and, preferably, greater than 97 weight percent. Alternatively, a seed layer, such as gold, can be sputtered on the adhesion/barrier layer, and then the bulk metal layer is electroplated on the seed layer.

In another case, the above-mentioned metal circuit layers 26a, 26b, 26c, 28, 30 and 32 may be composed of an adhesion/barrier layer and a bulk metal layer, for example. The adhesion/barrier layer is formed over and in touch with the above-mentioned passivation layer 20. The bulk metal layer is formed over the adhesion/barrier layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The bulk metal layer may have a thickness thicker than 1 micrometer, and preferably between 2 micrometers and 30 micrometers, wherein the bulk metal layer may comprise copper with greater than 90 weight percent, and, preferably, greater than 97 weight percent. Alternatively, a seed layer, such as copper, can be sputtered on the adhesion/barrier layer, and then the bulk metal layer is electroplated on the seed layer.

In another case, the above-mentioned metal circuit layers 26*a*, 26*b*, 26*c*, 28, 30 and 32 may be composed of an adhesion/barrier layer, a first metal layer and a second metal layer, for example. The adhesion/barrier layer is formed over and in touch with the above-mentioned passivation layer 20. The first metal layer is formed over the adhesion/barrier layer, and the second metal layer is formed over the first metal layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The first metal layer may have a thickness thicker than 1 micrometer, and preferably between 2 micrometers and 30 micrometers, wherein the first metal layer may comprise copper with greater than 90 weight percent, and, preferably, greater than 97 weight percent. The second metal layer comprises nickel, for example, and has a thickness thicker than 1 micrometer, and preferably between 2 micrometers and 5 micrometers. Alternatively, a seed layer, such as copper, can be sputtered on the adhesion/barrier layer, then the first metal layer is electroplated on the seed layer, and then the second metal layer is electroplated on the first metal layer.

In another case, the above-mentioned metal circuit layers 26*a*, 26*b*, 26*c*, 28, 30 and 32 are composed of an adhesion/barrier layer, a first metal layer, a second metal layer and a third metal layer, for example. The adhesion/barrier layer is formed over and in touch with the above-mentioned passivation layer 20. The first metal layer is formed over the adhesion/barrier layer, the second metal layer is formed on the first metal layer, and the third metal layer is formed on the second metal layer. The adhesion/barrier layer may comprise titanium, a titanium-tungsten alloy, titanium nitride, tantalum or tantalum nitride, for example. Alternatively, the adhesion/barrier layer may be formed by depositing a chromium layer and then depositing a chromium-copper layer on the chromium layer. The first metal layer may have a thickness thicker than 1 micrometer, and preferably between 2 micrometers and 30 micrometers, wherein the first metal layer may comprise copper with greater than 90 weight percent, and, preferably, greater than 97 weight percent. The second metal layer comprises nickel, for example, and has a thickness thicker than 1 micrometer, and preferably between 2 micrometers and 5 micrometers. The third metal layer is made of gold, for example, and has a thickness thicker than 100 angstroms, and preferably between 1 micrometer and 1000 angstroms. Alternatively, a seed layer, such as copper, can be sputtered on the adhesion/barrier layer, then the first metal layer is electroplated on the seed layer, then the second metal layer is electroplated on the first metal layer, and then the third metal layer is electroplated on the second metal layer.

The above-mentioned metal circuit layers 26*a*, 26*b*, 26*c*, 28, 30 and 32 may have a resistance times capacitance (RC product) of between about 5 and 50 times smaller than the RC product of the interconnection lines underlying the passivation layer 20, and preferably about 10 times smaller.

The bumps 24 and 25 as shown In FIGS. 1-4 may not be limited to the above description. Alternatively, the bump 24 or 25 can be divided into two groups. One group is reflowable or solder bump that comprises solder or other reflowable metals or metal alloys at the topmost of the reflowable or solder bump. The reflowable bumps are usually reflowed with a certain reflow temperature profile, typically ramping up from a starting temperature to a peak temperature, and then cooled down to a final temperature. The peak temperature is roughly set at the melting temperature of solder, or metals or metal alloys used for reflow or bonding purpose. The reflowable bump starts to reflow when the temperature reaches the melting temperature of solder, or reflowable metal, or reflowable metal alloys (i.e. is roughly the peak temperature) for over 20 seconds. The period of the whole temperature profile takes over 2 minutes, typically 5 to 45 minutes. In summary, the bumps are reflowed at the temperature of between 150 and 350 celsius degrees for more than 20 seconds or for more than 2 minutes. The reflowable bump comprises solder or other metals or alloys with melting point of between 150 and 350 celsius degrees. The reflowable bump comprises a lead-containing solder material, such as tin-lead alloy, or a lead-free solder material, such as tin-silver alloy or tin-silver-copper alloy at the topmost of the reflowable bump. Typically, the lead-free material may have a melting point greater than 185 celsius degrees, or greater than 200 celsius degrees, or greater than 250 celsius degrees. The other group is non-reflowable or non-solder bump that cannot be reflowed at the temperature of greater than 350 celsius degrees for more than 20 seconds or for more than 2 minutes. Each component of the non-reflowable or the non-solder bump does not reflow at the temperature of more than 350 celsius degrees for more than 20 seconds or for more than 2 minutes. The non-reflowable bump comprises metals or metal alloys with a melting point greater than 350 celsius degrees or greater than 400 celsius degrees, or greater than 600 celsius degrees. Moreover, the non-reflowable bump does not comprise any metals or metal alloys with melting temperature lower than 350 celsius degrees. The non-reflowable bump may have a topmost metal layer comprising gold with greater than 90 weight percent and, preferably, greater than 97 weight percent. Alternatively, the non-reflowable bump may have a topmost metal layer with gold ranging from 0 weight percent to 90 weight percent, or ranging from 0 weight percent to 50 weight percent, or ranging from 0 weight percent to 10 weight percent.

In this paragraph, the detailed non-reflowable or non-solder bump used for the bumps 24 as shown in FIGS. 1-4 is discussed. The bump 24 may only have a single metal layer having a thickness thicker than 5 micrometers, and preferably between 7 micrometers and 30 micrometers, for example. The single metal layer may comprise gold with greater than 90 weight percent, and, preferably, greater than 97 weight percent. Alternatively, the single metal layer may comprise copper with greater than 90 weight percent, and, preferably, greater than 97 weight percent. Alternatively, the single metal layer may comprise platinum with greater than 90 weight percent, and, preferably, greater than 97 weight percent. Alternatively, the single metal layer may comprise silver with greater than 90 weight percent, and, preferably, greater than 97 weight percent. Alternatively, the single metal layer may comprise palladium with greater than 90 weight percent, and, preferably, greater than 97 weight percent. Alternatively, the single metal layer may comprise rhodium with greater than 90 weight percent, and, preferably, greater than 97 weight percent. Alternatively, the bump 24 may be formed by depositing an adhesion/barrier layer and a bulk metal layer. The adhesion/barrier layer may be formed by electroplating a nickel layer on the metal circuit layer. The bulk metal layer may be electroplated with a thickness greater than 5 micrometers, preferably between 12 micrometers and 30 micrometers, on the adhesion/barrier layer made of nickel, wherein the bulk metal layer may comprise gold with greater than 90 weight percent, and, preferably, greater than 97 weight percent. Alternatively, the bulk metal layer may be electroplated with a thickness greater than 5 micrometers and, preferably, between 7 micrometers and 3 micrometers on the adhesion/barrier layer made of nickel, wherein the bulk metal layer may comprise copper with greater than 90 weight percent, and, preferably, greater than 97 weight percent. Alternatively, the bulk metal layer may be electroplated with a thickness greater than 5 micrometers and, preferably, between 7 micrometers and 30 micrometers on the adhesion/barrier layer made of nickel, wherein the bulk metal layer may comprise silver with greater than 90 weight percent, and, preferably, greater than 97 weight percent. Alternatively, the bulk metal layer may be electroplated with a thickness greater than 5 micrometers and, preferably, between 7 micrometers and 30 micrometers on the adhesion/barrier layer made of nickel, wherein the bulk metal layer may comprise platinum with greater than 90 weight percent, and, preferably, greater than 97 weight percent. Alternatively, the bulk metal layer may be electroplated with a thickness greater than 5 micrometers and, preferably, between 7 micrometers and 30 micrometers on the adhesion/barrier layer made of nickel, wherein the bulk metal layer may comprise palladium with greater than 90 weight percent, and, preferably, greater than 97 weight percent. Alternatively, the bulk metal layer may be electroplated with a thickness greater than 5 micrometers and, preferably, between 7 micrometers and 30 micrometers on the adhesion/barrier layer made of nickel, wherein the bulk metal layer may comprise rhodium with greater than 90 weight percent, and, preferably, greater than 97 weight percent. The above-mentioned various bumps 24 can be formed on the metal circuit layers 26a, 26b, 26c, 28, 30 and 32 with any one of the above-mentioned structures.

In this paragraph, the detailed reflowable or solder bump used for the bumps 24 as shown in FIGS. 1-4 is discussed. The bumps 24 may be formed by depositing an adhesion/barrier layer and a bulk metal layer. The adhesion/barrier layer may be formed by electroplating a nickel layer on the metal circuit layer 26a, 26b, 2c, 28, 30 or 32. The bulk metal layer may be formed by electroplating a solder layer with a thickness between 25 micrometers and 300 micrometers on the adhesion/barrier layer made of nickel, wherein the solder layer may be a tin-lead alloy, a tin-silver-copper alloy, a tin-silver alloy or other solder material. The above-mentioned various bumps 24 can be formed on the metal circuit layer 26a, 26b, 26c, 28, 30 and 32 with any one of the above-mentioned structures.

In this paragraph, the detailed non-reflowable or non-solder bump used for the bump 25 as shown in FIG. 4 is discussed. The bump 25 may be formed by sputtering an adhesion/barrier layer on a contact point of the topmost fine line metal layer 18 and then electroplating a bulk metal layer on the adhesion/barrier layer. The bump 25 may be formed by sputtering a titanium-tungsten alloy, functioning as a adhesion/barrier layer, on a contact point of the topmost fine line metal layer 18, and then electroplating a bulk metal layer with a thickness greater than 5 micrometers, and preferably between 7 micrometers and 100 micrometers, on the adhesion/barrier layer, wherein the bulk metal layer may comprise gold with greater than 90 weight percent, and, preferably, greater than 97 weight percent, or the bulk metal layer may comprise copper with greater than 90 weight percent, and, preferably, greater than 97 weight percent, or the bulk metal layer may comprise silver with greater than 90 weight percent, and, preferably, greater than 97 weight percent, or the bulk metal layer may comprise platinum with greater than 90 weight percent, and, preferably, greater than 97 weight percent, or the bulk metal layer may comprise palladium with greater than 90 weight percent, and, preferably, greater than 97 weight percent, or the bulk metal layer may comprise rhodium with greater than 90 weight percent, and, preferably, greater than 97 weight percent. The above-mentioned various bumps 25 can be formed with the metal circuit 32 having any one of the above-mentioned structures and the bumps 24 having any one of the above-mentioned structures.

In this paragraph, the detailed reflowable or solder bump used for the bump 25 as shown in FIG. 4 is discussed. The bump 25 may be formed by sputtering an adhesion/barrier layer on a contact point of the topmost fine line metal layer 18 and then electroplating a bulk metal layer on the adhesion/barrier layer. The bump 25 may be formed by sputtering titanium, a titanium-tungsten alloy, chromium or a chromium-copper alloy, functioning as an adhesion/barrier layer, on a contact point of the topmost fine line metal layer 18, sputtering a copper layer, functioning as a seed layer, on the adhesion/barrier layer, electroplating another copper layer on the seed layer, electroplating a nickel layer on the top copper layer, and then electroplating a solder layer with a thickness between 25 micrometers and 300 micrometers, wherein the solder layer may be a tin-lead alloy, a tin-silver-copper alloy, a tin-silver alloy or other solder materials. The above-mentioned various bump 25 can be formed with the metal circuit 32 having any one of the above-mentioned structures and the bumps 24 having any one of the above-mentioned structures.

Figure 5:
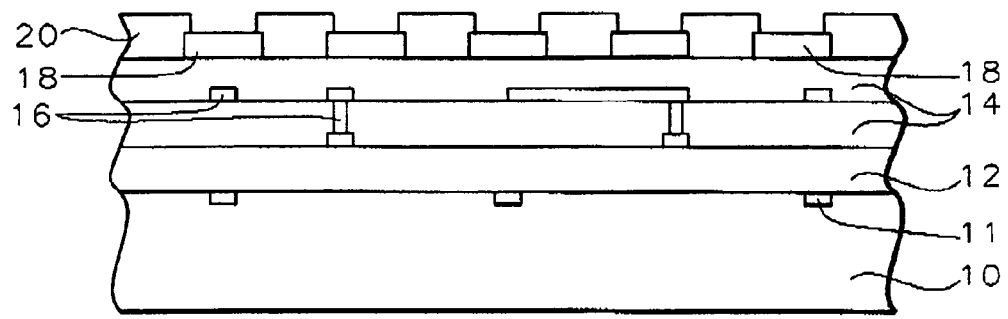
FIGS. 5 through 11 are cross-sectional views of a first preferred embodiment of the method of the present invention.

Referring now to FIGS. 5-12, the process of manufacturing the above-mentioned circuits and bumps of the present invention will be described. Referring now more particularly to FIG. 5, there is shown a wafer having contact pads, such as I/O pads, as illustrated in FIGS. 1-4. Openings have been made in the passivation layer 20 to the contact pads of the topmost fine line metal layer 18.

Figure 6:
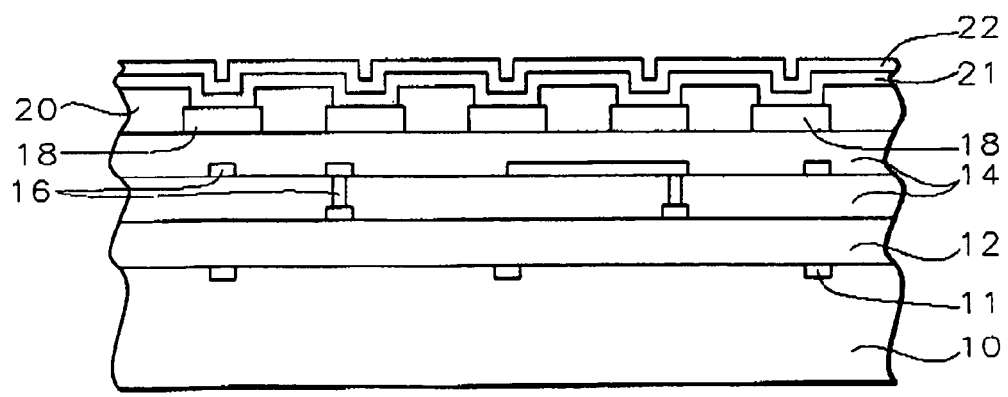

Referring now to FIG. 6, an adhesion and diffusion barrier layer 21 is deposited by sputtering or chemical vapor depositing on the passivation layer 20 and the contact pads of the topmost fine line metal layer 18. The adhesion/barrier layer may comprise TiW, Ti, TaN, TiN, Ta, Cr or a CrCu alloy and have a thickness of between about 1000 and 10,000 Angstroms. Next, a seed layer 22 is deposited by sputtering or electroplating on the adhesion/barrier layer. The seed layer 22 may comprise gold or copper having a thickness of between about 1000 and 10,000 Angstroms. In a first case, a seed layer of gold may be sputtered or electroplated on an adhesion/barrier layer of TiW. In another case, a seed layer of copper may be sputtered or electroplated on an adhesion/barrier layer of Ti.

Figure 7:
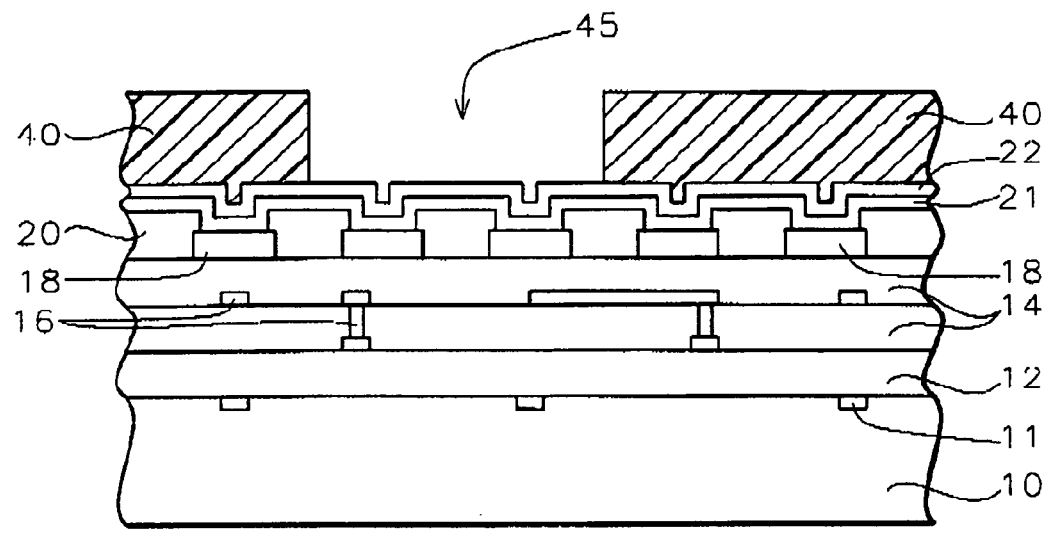

The wafer is coated with photoresist. The photoresist is patterned using a lithographic process to form a photoresist mask 40. An opening 45 is formed through the photoresist mask 40 and exposes the gold or copper seed layer, as shown in FIG. 7.

Figure 8:
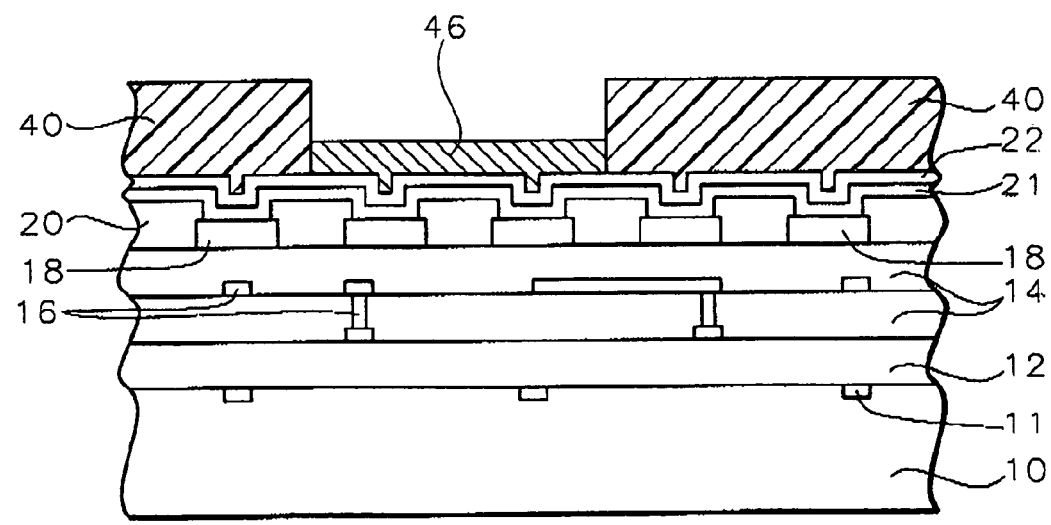

Using an electroplating process, a metal layer 46 is selectively deposited on the gold or copper seed layer 22 exposed by the opening 45 in the photoresist mask 40, as shown in FIG. 8. In a first case, the metal layer 46 can be formed by electroplating a bulk metal layer having a thickness thicker than 1 micrometer, and preferably between 2 micrometers and 30 micrometers, and comprising gold with greater than 90 weight percent, and, preferably, greater than 97 weight percent on the seed layer 22, preferably made of gold, exposed by the opening 45 in the photoresist mask 40. In another example, the metal layer 46 can be formed by electroplating a bulk metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40. In another case, the metal layer 46 can be formed by electroplating a first metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40, and then electroplating a second metal layer having a thickness thicker than 1 micrometer, and preferably between 2 micrometers and 5 micrometers and comprising nickel with greater than 90 weight percent, and, preferably, greater than 97 weight percent on the first metal layer. In another case, the metal layer 46 can be formed by electroplating a first metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40, then electroplating a second metal layer having a thickness thicker than 1 micrometer, and preferably between 2 micrometers and 5 micrometers and comprising nickel with greater than 90 weight percent, and, preferably, greater than 97 weight percent on the first metal layer, and then electroplating a third metal layer having a thickness thicker than 100 angstroms, and preferably between 1000 angstroms and 1 micrometer and comprising gold with greater than 90 weight percent, and, preferably, greater than 97 weight percent on the second metal layer.

Figure 9:
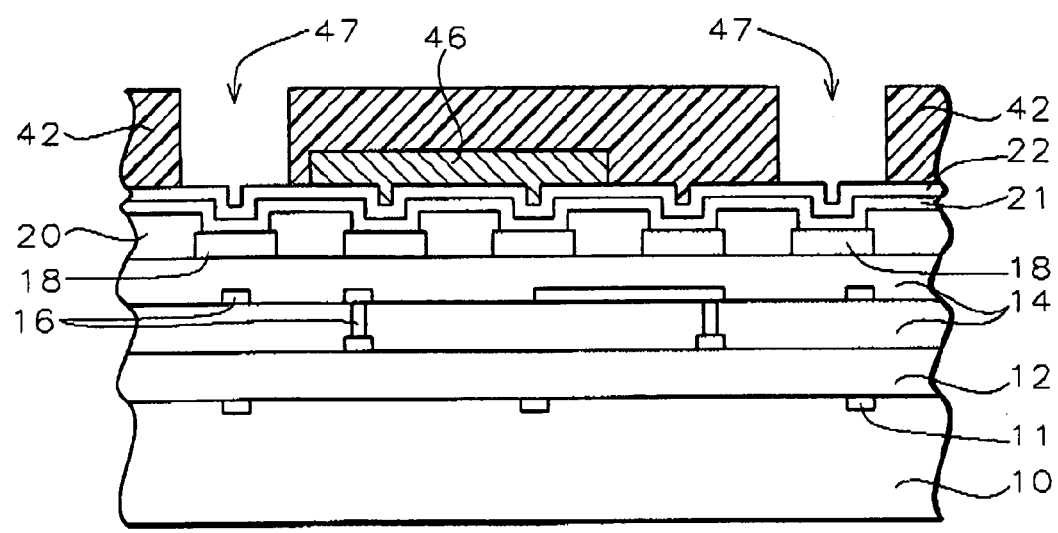

After forming the metal layer 46, the photoresist mask 40 is removed. Now, a second photoresist mask 42 is formed, covering the metal layer 46. Multiple openings 47 are formed in the second photoresist mask 42 to expose the seed layer 22 over the contact pad of the topmost thin film metal layer 18, as shown in FIG. 9.

Figure 10:
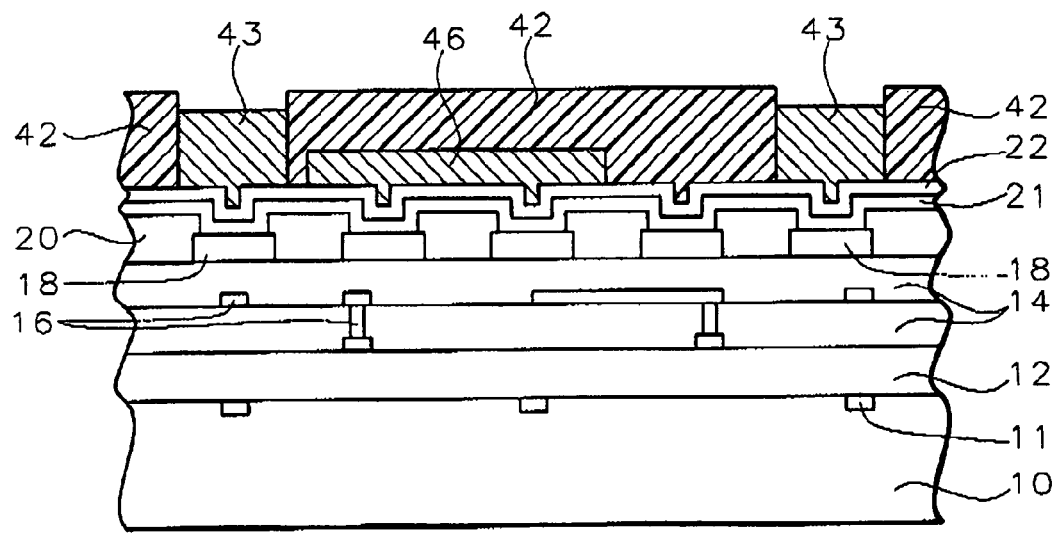

Thereafter, a metal layer 43 used to form bumps can be electroplated on the seed layer 22 exposed by the opening 47 in the second photoresist mask 42, as illustrated in FIG. 10. In a first case, the metal layer 43 can be formed by electroplating a bulk metal layer having a thickness thicker than 5 micrometers, and preferably between 7 micrometers and 100 micrometers, and comprising gold with greater than 90 weight percent, and, preferably, greater than 97 weight percent on the seed layer 22, preferably made of gold, exposed by the opening 47 in the photoresist mask 42. In another case, the metal layer 43 can be formed by electroplating a bulk metal layer having a thickness thicker than 5 micrometers, and preferably between 7 micrometers and 100 micrometers, and comprising copper with greater than 90 weight percent, and, preferably, greater than 97 weight percent on the seed layer 22, preferably made of copper, exposed by the opening 47 in the photoresist mask 42. In another case, the metal layer 43 can be formed by electroplating a bulk metal layer having a thickness thicker than 5 micrometers, and preferably between 7 micrometers and 100 micrometers, and comprising silver with greater than 90 weight percent, and, preferably, greater than 97 weight percent on the seed layer 22, preferably made of silver, exposed by the opening 47 in the photoresist mask 42. In another case, the metal layer 43 can be formed by electroplating a bulk metal layer having a thickness thicker than 5 micrometers, and preferably between 7 micrometers and 100 micrometers, and comprising platinum with greater than 90 weight percent, and, preferably, greater than 97 weight percent on the seed layer 22, preferably made of platinum, exposed by the opening 47 in the photoresist mask 42. In another case, the metal layer 43 can be formed by electroplating a bulk metal layer having a thickness thicker than 5 micrometers, and preferably between 7 micrometers and 100 micrometers, and comprising palladium with greater than 90 weight percent, and, preferably, greater than 97 weight percent on the seed layer 22, preferably made of palladium, exposed by the opening 47 in the photoresist mask 42. In another case, the metal layer 43 can be formed by electroplating a bulk metal layer having a thickness thicker than 5 micrometers, and preferably between 7 micrometers and 100 micrometers, and comprising rhodium with greater than 90 weight percent, and, preferably, greater than 97 weight percent on the seed layer 22, preferably made of rhodium, exposed by the opening 47 in the photoresist mask 42. In another case, the metal layer 43 can be formed by electroplating a first metal layer having a thickness thicker than 1 micrometer, and preferably between 2 micrometers and 10 micrometers, and comprising copper with greater than 90 weight percent, and, preferably, greater than 97 weight percent on the seed layer 22, preferably made of copper, exposed by the opening 47 in the photoresist mask 42, then electroplating a second metal layer having a thickness thicker than 1 micrometer, and preferably between 1 micrometer and 5 micrometers, and comprising nickel with greater than 90 weight percent, and, preferably, greater than 97 weight percent on the first metal layer, and then electroplating a solder layer having a thickness between 25 micrometers and 300 micrometers and comprising a lead-containing solder material, such as a tin-lead alloy, or a lead-free solder material, such as a tin-silver alloy or a tin-silver-copper alloy, on the second metal layer.

Figure 11:
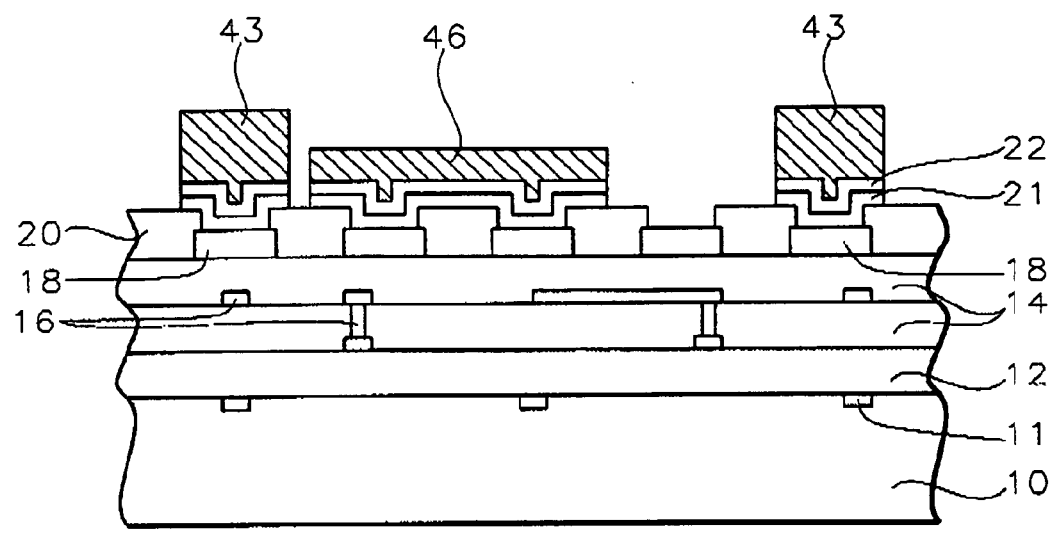

After forming the metal layer 43, the photoresist mask 42 is removed. Thereafter the seed layer 22 and the adhesion/barrier layer 21 are selectively removed where they are not covered by the metal layers 46 and 43, as shown in FIG. 11.

Figure 12:
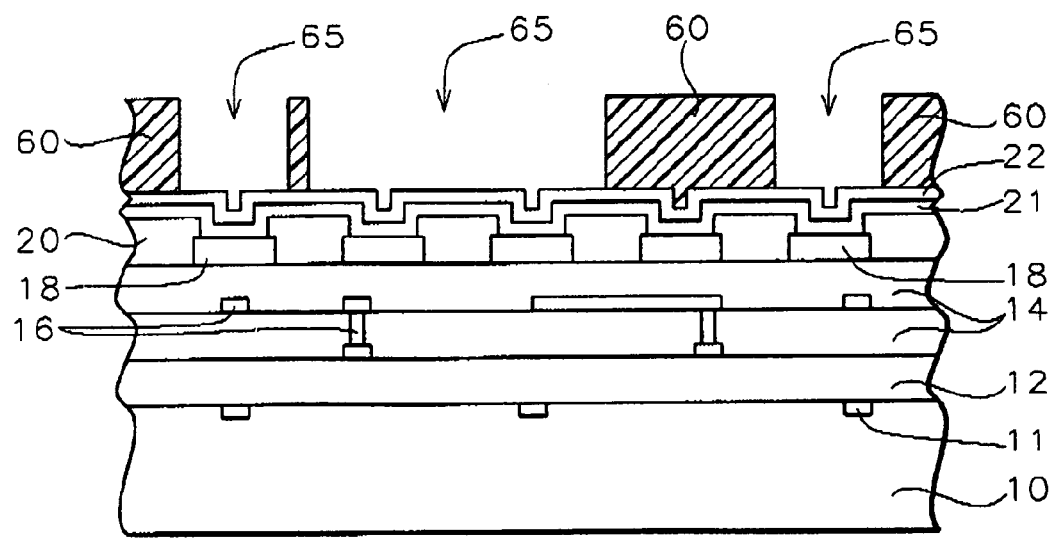
FIGS. 12 through 16 are cross-sectional views of a second preferred embodiment of the method of the present invention.
Figure 13:
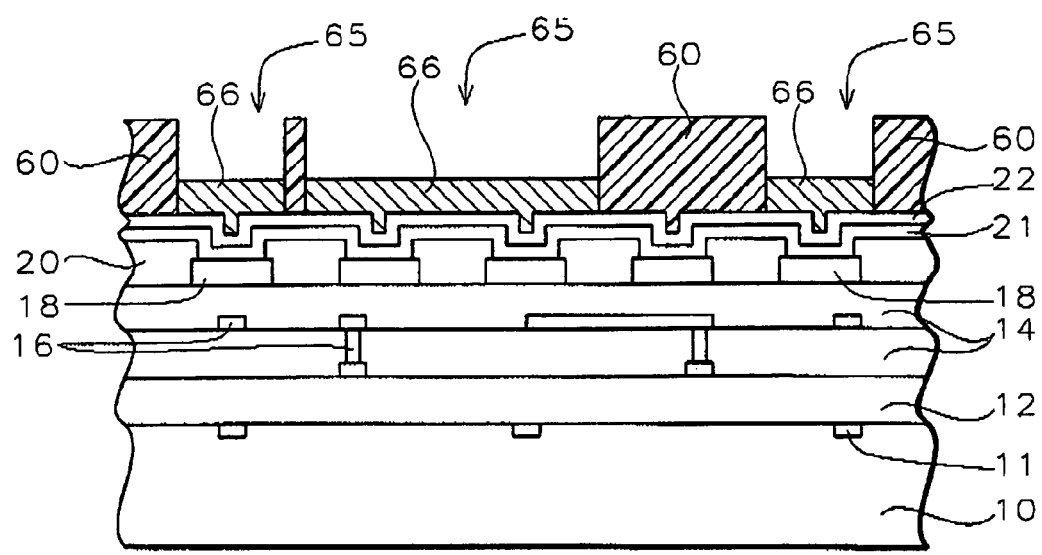
Figure 14:
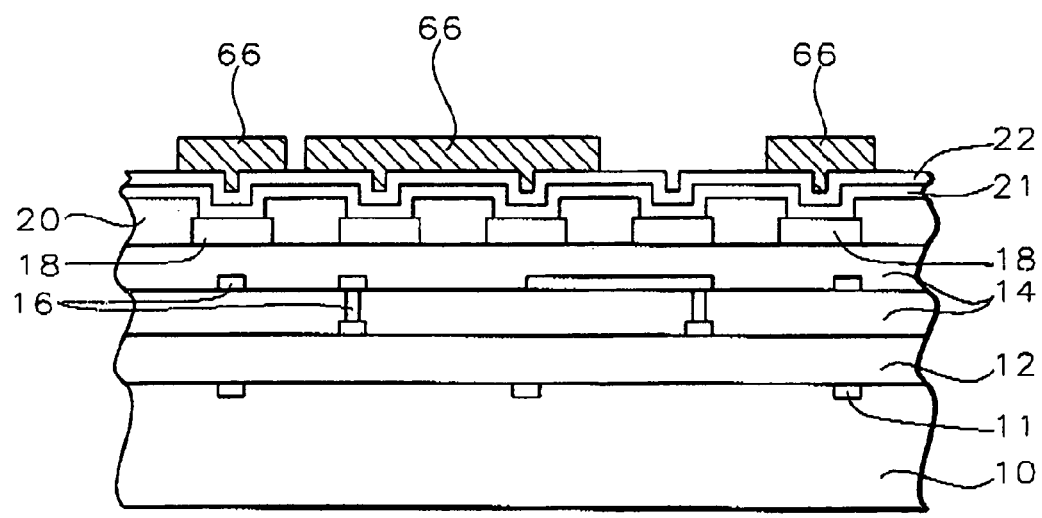

In a second preferred embodiment for a method of manufacturing of the present invention, multiple bumps can be formed on a metal circuit layer. Processing proceeds as described above through FIG. 6. Then, as shown in FIG. 12, a photoresist mask 60 is formed on the seed layer 22. Multiple openings 65 are formed in the photoresist mask 60 and expose the seed layer 22. Thereafter, as shown in FIG. 13, using an electroplating process, a metal layer 66 is selectively deposited on the gold or copper seed layer 22 exposed by the opening 65 in the photoresist mask 60. In a first case, the metal layer 66 can be formed by electroplating a bulk metal layer having a thickness thicker than 1 micrometer, and preferably between 2 micrometers and 30 micrometers, and comprising gold with greater than 90 weight percent, and, preferably, greater than 97 weight percent on the seed layer 22, preferably made of gold, exposed by the opening 45 in the photoresist mask 40. In a second case, the metal layer 66 can be formed by electroplating a bulk metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40. In a third case, the metal layer 66 can be formed by electroplating a first metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40, and then electroplating a second metal layer having a thickness thicker than 1 micrometer, and preferably between 2 micrometers and 5 micrometers and comprising nickel with greater than 90 weight percent, and, preferably, greater than 97 weight percent on the first metal layer. In a fourth case, the metal layer 66 can be formed by electroplating a first metal layer having a thickness thicker than 1 micrometer, and preferably between 2 micrometers and 30 micrometers, and comprising copper with greater than 90 weight percent, and, preferably, greater than 97 weight percent on the seed layer 22, preferably made of copper, exposed by the opening 45 in the photoresist mask 40, then electroplating a second metal layer having a thickness thicker than 1 micrometer, and preferably between 2 micrometers and 5 micrometers and comprising nickel with greater than 90 weight percent, and, preferably, greater than 97 weight percent on the first metal layer, and then electroplating a third metal layer having a thickness thicker than 100 angstroms, and preferably between 1000 angstroms and 1 micrometer and comprising gold with greater than 90 weight percent, and, preferably, greater than 97 weight percent on the second metal layer. After the metal layer 66 is formed, the photoresist mask 60 is removed, as shown in FIG. 14.

Figure 15:
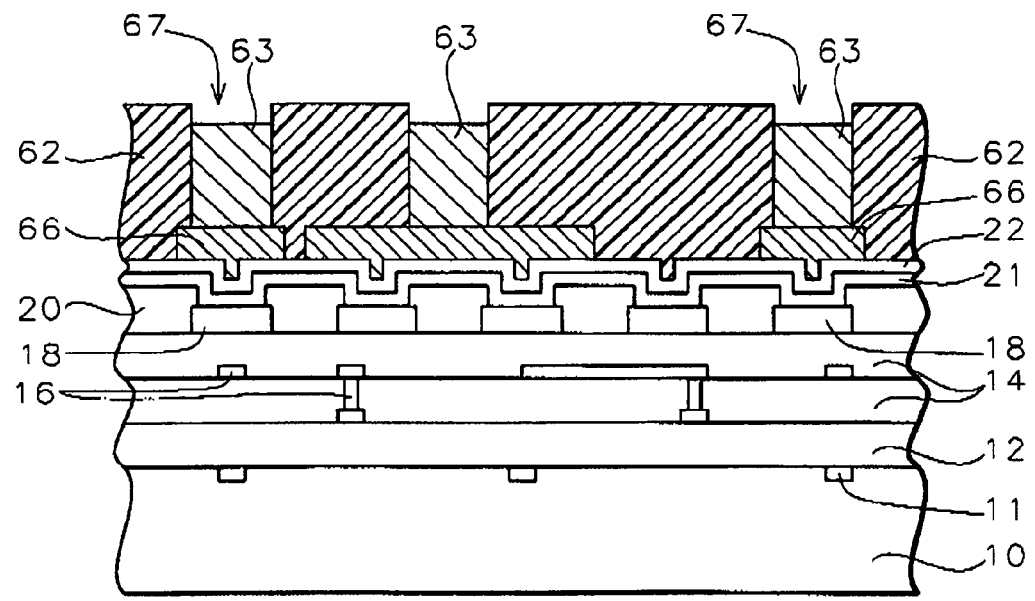

Now, a second photoresist mask 62 is formed on the seed layer 22 and the metal layer 66 where no bump will be formed, as shown in FIG. 15. Multiple openings 67 are formed in the photoresist mask 62 and expose the metal layer 66 over the contact pad of the topmost fine line metal layer. Thereafter, a metal layer 63 used to form bumps can be electroplated on the metal layer 66 exposed by the opening 67 in the second photoresist mask 62, as illustrated in FIG. 15. In a first case, the metal layer 63 can be formed by electroplating a bulk metal layer having a thickness thicker than 5 micrometers, and preferably between 7 micrometers and 30 micrometers, and comprising gold with greater than 90 weight percent, and, preferably, greater than 97 weight percent on the metal layer 66, preferably, with the structure described in the above-mentioned first or fourth case, exposed by the opening 67 in the photoresist mask 62. In another case, the metal layer 63 can be formed by electroplating a bulk metal layer having a thickness thicker than 5 micrometers, and preferably between 7 micrometers and 30 micrometers, and comprising copper with greater than 90 weight percent, and, preferably, greater than 97 weight percent on the metal layer 66, preferably, with the structure described in the above-mentioned second case, exposed by the opening 67 in the photoresist mask 62. In another case, the metal layer 63 can be formed by electroplating a bulk metal layer having a thickness thicker than 5 micrometers, and preferably between 7 micrometers and 30 micrometers, and comprising silver with greater than 90 weight percent, and, preferably, greater than 97 weight percent on the metal layer 66, preferably, with a topmost silver layer, exposed by the opening 67 in the photoresist mask 62. In another case, the metal layer 63 can be formed by electroplating a bulk metal layer having a thickness thicker than 5 micrometers, and preferably between 7 micrometers and 30 micrometers, and comprising platinum with greater than 90 weight percent, and, preferably, greater than 97 weight percent on the metal layer 66, preferably, with a topmost platinum layer, exposed by the opening 67 in the photoresist mask 62. In another case, the metal layer 63 can be formed by electroplating a bulk metal layer having a thickness thicker than 5 micrometers, and preferably between 7 micrometers and 30 micrometers, and comprising palladium with greater than 90 weight percent, and, preferably, greater than 97 weight percent on the metal layer 66, preferably, with a topmost palladium layer, exposed by the opening 67 in the photoresist mask 62. In another case, the metal layer 43 can be formed by electroplating a bulk metal layer having a thickness thicker than 5 micrometers, and preferably between 7 micrometers and 30 micrometers, and comprising rhodium with greater than 90 weight percent, and, preferably, greater than 97 weight percent on the metal layer 66, preferably, with a topmost rhodium layer, exposed by the opening 67 in the photoresist mask 62. In another case, the metal layer 63 can be formed by electroplating a solder layer having a thickness thicker than 10 micrometers, and preferably between 25 micrometers and 300 micrometers, and comprising a lead-containing solder material, such as a tin-lead alloy, or a lead-free solder material, such as a tin-silver alloy or a tin-silver-copper alloy, on the metal layer 66, preferably, with the structure described in the above-mentioned third case, exposed by the opening 67 in the photoresist mask 62.

Alternatively, the metal layer 63 may be formed with an adhesion/barrier layer. In a first case, the metal layer 63 can be formed by electroplating an adhesion/barrier layer on the metal layer 66, preferably, with the structure described in the above-mentioned first, second, third or fourth case, exposed by the opening 67 in the photoresist mask 62, and then electroplating a bulk metal layer on the adhesion/barrier layer. The adhesion/barrier layer may have a thickness thicker than 1 micrometer, and preferably between 1 micrometer and 5 micrometers, and may comprise nickel with greater than 90 weight percent, and, preferably, greater than 97 weight percent. The bulk metal layer may have a thickness thicker than 5 micrometers, and preferably between 7 micrometers and 30 micrometers, and may comprise gold with greater than 90 weight percent, and, preferably, greater than 97 weight percent. Alternatively, the bulk metal layer may have a thickness thicker than 5 micrometers, and preferably between 7 micrometers and 30 micrometers, and may comprises copper with greater than 90 weight percent, and, preferably, greater than 97 weight percent. Alternatively, the bulk metal layer may have a thickness thicker than 5 micrometers, and preferably between 7 micrometers and 30 micrometers, and may comprises silver with greater than 90 weight percent, and, preferably, greater than 97 weight percent. Alternatively, the bulk metal layer may have a thickness thicker than 5 micrometers, and preferably between 7 micrometers and 30 micrometers, and may comprises platinum with greater than 90 weight percent, and, preferably, greater than 97 weight percent. Alternatively, the bulk metal layer may have a thickness thicker than 5 micrometers, and preferably between 7 micrometers and 30 micrometers, and may comprises palladium with greater than 90 weight percent, and, preferably, greater than 97 weight percent. Alternatively, the bulk metal layer may have a thickness thicker than 5 micrometers, and preferably between 7 micrometers and 30 micrometers, and may comprises rhodium with greater than 90 weight percent, and, preferably, greater than 97 weight percent. In another case, the metal layer 63 can be formed by electroplating an adhesion/barrier layer on the metal layer 66, preferably, with the structure described in the above-mentioned first, second, third or fourth case, exposed by the opening 67 in the photoresist mask 62, and then electroplating a solder layer on the adhesion/barrier layer. The adhesion/barrier layer may have a thickness thicker than 1 micrometer, and preferably between 1 micrometer and 5 micrometers, and may comprise nickel with greater than 90 weight percent, and, preferably, greater than 97 weight percent. The solder layer may have a thickness thicker than 10 micrometers, and preferably between 25 micrometers and 300 micrometers, and may comprises a lead-containing solder material, such as a tin-lead alloy, or a lead-free solder material, such as a tin-silver alloy or a tin-silver-copper alloy.

Figure 16:
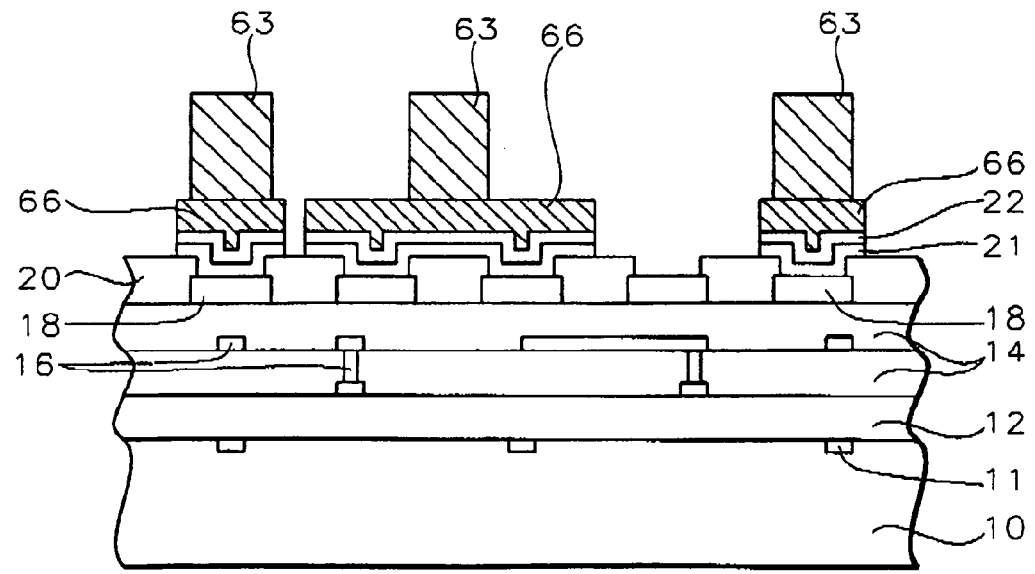

After forming the metal layer 63 on the metal layer 66, the photoresist mask 62 is removed. Thereafter, the seed layer 22 and the adhesion/barrier layer 21 not covered by the metal layer 66 are then removed, as shown in FIG. 16.

The above-mentioned process as shown in FIGS. 12-16 can be applied to form the metal circuits 26a, 26b, 26c, 28, 30 and 32 and the bumps 24 shown in FIGS. 1-4.

The above-mentioned process for forming the circuit lines and the bumps is performed over a semiconductor wafer. After the circuit lines and the bumps are deposited over the semiconductor wafer, the semiconductor wafer is divided into multiple chips using a cutting process.

While this invention has been particularly shown and described with reference to the preferred embodiments thereof, it will be understood by those skilled in the art that various changes in form and details may be made without departing from the spirit and scope of the invention.

What is claimed is:

1. An integrated circuit die comprising:
   a semiconductor substrate;
   multiple electronic devices in and on said semiconductor substrate;
   an interconnection structure over said semiconductor substrate, wherein said interconnection structure comprises a first interconnection layer and a second interconnection layer over said first interconnection layer;
   a passivation layer over said interconnection structure, wherein a first opening in said passivation layer is over a first contact point of said interconnection structure, and said first contact point is at a bottom of said first opening, wherein a second opening in said passivation layer is over a second contact point of said interconnection structure, and said second contact point is at a bottom of said second opening, wherein a third opening in said passivation layer is over a third contact point of said interconnection structure, and said third contact point is at a bottom of said third opening, and wherein a fourth opening in said passivation layer is over a fourth contact point of said interconnection structure, and said fourth contact point is at a bottom of said fourth opening;
   a third interconnection layer on said passivation layer and on said first, second, third and fourth contact points, wherein said first, second, third and fourth contact points are connected to one another through said third interconnection layer, wherein said third interconnection layer has a thickness greater than that of said first interconnection layer and that of said second interconnection layer, respectively, wherein said third interconnection layer comprises a bottom layer on said passivation layer and on said first, second, third and fourth contact points, and a first plated metal layer on said bottom layer, wherein said bottom layer comprises an adhesion layer and a seed layer;
   a first metal bump on said third interconnection layer and over said first plated metal layer, wherein said first metal bump has a thickness greater than that of said third interconnection layer, and wherein said first metal bump is connected to said first, second, third and fourth contact points through said third interconnection layer; and
   a second metal bump on said third interconnection layer and over said first plated metal layer, wherein said second metal bump has a thickness greater than that of said third interconnection layer, wherein said second metal bump is connected to said first, second, third and fourth contact points through said third interconnection layer, wherein said second metal bump is connected to said first metal bump through said third interconnection layer, and wherein said first and second metal bumps are provided by a metal layer comprising a second plated metal layer over said first plated metal layer.

2. The integrated circuit die of claim 1, wherein said first plated metal layer comprises gold.

3. The integrated circuit die of claim 1, wherein said second plated metal layer comprises gold.

4. The integrated circuit die of claim 1, wherein said third interconnection layer comprises a ground bus on said passivation layer and on said first, second, third and fourth contact points, wherein said first, second, third and fourth contact points are connected to one another through said ground bus, wherein said first metal bump is connected to said first, second, third and fourth contact points through said ground bus, and wherein said second metal bump is connected to said first, second, third and fourth contact points through said ground bus.

5. The integrated circuit die of claim 1, wherein said third interconnection layer comprises a power bus on said passivation layer and on said first, second, third and fourth contact points, wherein said first, second, third and fourth contact points are connected to one another through said power bus, wherein said first metal bump is connected to said first, second, third and fourth contact points through said power bus, and wherein said second metal bump is connected to said first, second, third and fourth contact points through said power bus.

6. The integrated circuit die of claim 1, wherein said first metal bump is further over said first contact point.

7. The integrated circuit die of claim 1, wherein said first metal bump is further over said first contact point, and said second metal bump is further over said second contact point.

8. An integrated circuit die comprising:
   a semiconductor substrate;
   multiple electronic devices in and on said semiconductor substrate;
   an interconnection structure over said semiconductor substrate, wherein said interconnection structure comprises a first interconnection layer and a second interconnection layer over said first interconnection layer;
   a passivation layer over said interconnection structure, wherein a first opening in said passivation layer is over a first contact point of said interconnection structure, and said first contact point is at a bottom of said first opening, wherein a second opening in said passivation layer is over a second contact point of said interconnection structure, and said second contact point is at a bottom of said second opening, wherein a third opening in said passivation layer is over a third contact point of said interconnection structure, and said third contact point is at a bottom of said third opening, and wherein a fourth opening in said passivation layer is over a fourth contact point of said interconnection structure, and said fourth contact point is at a bottom of said fourth opening;
   a third interconnection layer on said passivation layer and on said first, second, third and fourth contact points, wherein said first, second, third and fourth contact points are connected to one another through said third interconnection layer, wherein said third interconnection layer has a thickness greater than that of said first interconnection layer and that of said second interconnection layer, respectively, wherein said third interconnection layer comprises a bottom layer on said passivation layer and on said first, second, third and fourth contact points, and a plated metal layer on said bottom layer, wherein said bottom layer comprises an adhesion layer and a seed layer;

a first metal bump on said third interconnection layer and over said plated metal layer, wherein said first metal bump has a thickness greater than that of said third interconnection layer, wherein said first metal bump is connected to said first, second, third and fourth contact points through said third interconnection layer, and wherein said first metal bump comprises gold at a top of said first metal bump; and a second metal bump on said third interconnection layer and over said plated metal layer, wherein said second metal bump has a thickness greater than that of said third interconnection layer, wherein said second metal bump is connected to said first, second, third and fourth contact points through said third interconnection layer, wherein said second metal bump is connected to said first metal bump through said third interconnection layer, and wherein said second metal bump comprises gold at a top of said second metal bump.

9. The integrated circuit die of claim 8, wherein said plated metal layer comprises gold.

10. The integrated circuit die of claim 8, wherein said third interconnection layer comprises a ground bus on said passivation layer and on said first, second, third and fourth contact points, wherein said first, second, third and fourth contact points are connected to one another through said ground bus, wherein said first metal bump is connected to said first, second, third and fourth contact points through said ground bus, and wherein said second metal bump is connected to said first, second, third and fourth contact points through said ground bus.

11. The integrated circuit die of claim 8, wherein said third interconnection layer comprises a power bus on said passivation layer and on said first, second, third and fourth contact points, wherein said first, second, third and fourth contact points are connected to one another through said power bus, wherein said first metal bump is connected to said first, second, third and fourth contact points through said power bus, and wherein said second metal bump is connected to said first, second, third and fourth contact points through said power bus.

12. The integrated circuit die of claim 8, wherein said first metal bump is further over said first contact point.

13. The integrated circuit die of claim 8, wherein said first metal bump is further over said first contact point, and said second metal bump is further over said second contact point.

14. The integrated circuit die of claim 8, wherein said first metal bump is not vertically over said first contact point, said second contact point and said third contact point.

15. An integrated circuit die comprising:
a semiconductor substrate;
multiple electronic devices in and on said semiconductor substrate;
an interconnection structure over said semiconductor substrate, wherein said interconnection structure comprises a first interconnection layer and a second interconnection layer over said first interconnection layer;
a passivation layer over said interconnection structure, wherein a first opening in said passivation layer is over a first contact point of said interconnection structure, and said first contact point is at a bottom of said first opening, wherein a second opening in said passivation layer is over a second contact point of said interconnection structure, and said second contact point is at a bottom of said second opening, wherein a third opening in said passivation layer is over a third contact point of said interconnection structure, and said third contact point is at a bottom of said third opening, and wherein a fourth opening in said passivation layer is over a fourth contact point of said interconnection structure, and said fourth contact point is at a bottom of said fourth opening;

a ground bus on said passivation layer and on said first, second, third and fourth contact points, wherein said first, second, third and fourth contact points are connected to one another through said ground bus, wherein said ground bus has a thickness greater than that of said first interconnection layer and that of said second interconnection layer, respectively, wherein said ground bus comprises a bottom layer on said passivation layer and on said first, second, third and fourth contact points, and a first plated metal layer on said bottom layer, wherein said bottom layer comprises an adhesion layer and a seed layer;

a first metal bump on said ground bus and over said first plated metal layer, wherein said first metal bump has a thickness greater than that of said ground bus, and wherein said first metal bump is connected to said first, second, third and fourth contact points through said ground bus; and a second metal bump on said ground bus and over said first plated metal layer, wherein said second metal bump has a thickness greater than that of said ground bus, wherein said second metal bump is connected to said first, second, third and fourth contact points through said ground bus, wherein said second metal bump is connected to said first metal bump through said ground bus, and wherein said first and second metal bumps are provided by a metal layer comprising a second plated metal layer over said first plated metal layer.

16. The integrated circuit die of claim 15, wherein said first plated metal layer comprises gold.

17. The integrated circuit die of claim 15, wherein said second plated metal layer comprises gold.

18. The integrated circuit die of claim 15, wherein said first metal bump is further over said first contact point.

19. The integrated circuit die of claim 15, wherein said first metal bump is further over said first contact point, and said second metal bump is further over said second contact point.

20. The integrated circuit die of claim 15, wherein said first metal bump is not vertically over said first contact point, said second contact point and said third contact point.

21. An integrated circuit die comprising:
a semiconductor substrate;
multiple electronic devices in and on said semiconductor substrate;
an interconnection structure over said semiconductor substrate, wherein said interconnection structure comprises a first interconnection layer and a second interconnection layer over said first interconnection layer;
a passivation layer over said interconnection structure, wherein a first opening in said passivation layer is over a first contact point of said interconnection structure, and said first contact point is at a bottom of said first opening, wherein a second opening in said passivation layer is over a second contact point of said interconnection structure, and said second contact point is at a bottom of said second opening, wherein a third opening in said passivation layer is over a third contact point of said interconnection structure, and said third contact point is at a bottom of said third opening, and wherein a fourth opening in said passivation layer is over a fourth contact point of said interconnection structure, and said fourth contact point is at a bottom of said fourth opening;

a first interconnect on said passivation layer and on said first and second contact points, wherein said first contact point is connected to said second contact point through said first interconnect;

a second interconnect on said passivation layer and on said third and fourth contact points, wherein a gap is between said first and second interconnects, wherein said third contact point is connected to said fourth contact point through said second interconnect, wherein said first and second interconnects are provided by a circuit layer comprising a bottom layer on said passivation layer and on said first, second, third and fourth contact points, and a first plated metal layer on said bottom layer, wherein said bottom layer comprises an adhesion layer and a seed layer; and a metal bump on said first interconnect, vertically over said first contact point and over said first plated metal layer, wherein said metal bump has a thickness greater than that of said first interconnect, wherein said metal bump is connected to said first and second contact points through said first interconnect, wherein said metal bump comprises a second plated metal layer over said first plated metal layer, wherein there is no metal bump on said second interconnect.

22. The integrated circuit die of claim 21, wherein said first plated metal layer comprises gold.

23. The integrated circuit die of claim 21, wherein said second plated metal layer comprises gold.

* * * * *